(12) United States Patent
Kwak et al.

(10) Patent No.: US 7,092,420 B2
(45) Date of Patent: Aug. 15, 2006

(54) SUBMOUNT OF SEMICONDUCTOR LASER DIODE, METHOD OF MANUFACTURING THE SAME, AND SEMICONDUCTOR LASER DIODE ASSEMBLY USING THE SUBMOUNT

(75) Inventors: Joon-seop Kwak, Kyungki-do (KR); Su-hee Chae, Kyungki-do (KR); Youn-joon Sung, Kyungki-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/732,241

(22) Filed: Dec. 11, 2003

(65) Prior Publication Data

US 2005/0002428 A1    Jan. 6, 2005

(30) Foreign Application Priority Data

Mar. 8, 2003    (KR) .............. 10-2003-0014613

(51) Int. Cl.
*H01S 5/00* (2006.01)

(52) U.S. Cl. .................. 372/43.01; 372/34; 372/36

(58) Field of Classification Search .................. 372/34, 372/36, 43.01
See application file for complete search history.

(56) References Cited

U.S. PATENT DOCUMENTS 6,479,325 B1 *    11/2002    Ozawa ............... 438/119
2005/0194690 A1 *    9/2005    Ishii et al. ............ 257/772

* cited by examiner

*Primary Examiner*—Minsun Oh Harvey
*Assistant Examiner*—Delma R. Flores-Ruiz

(57) ABSTRACT

Provided is a submount flip-chip bonded to a semiconductor laser diode chip with stepped first and second electrodes. The submount includes a substrate having first and second surfaces which are separated by a step height corresponding to a height difference between the first and second electrodes; first and second metal layers being formed to the same thickness on the first and second surfaces, respectively; and first and second solder layers being formed to the same thickness on the first and second metal layers, respectively, and being bonded to the first and second electrodes, respectively.

5 Claims, 7 Drawing Sheets

SUBMOUNT OF SEMICONDUCTOR LASER DIODE, METHOD OF MANUFACTURING THE SAME, AND SEMICONDUCTOR LASER DIODE ASSEMBLY USING THE SUBMOUNT

BACKGROUND OF THE INVENTION

This application claims the priority of Korean Patent Application No. 2003-14613, filed on Mar. 8, 2003, in the Korean Intellectual Property Office, the disclosure of which is incorporated herein in its entirety by reference.

1. Field of the Invention

The present invention relates to a semiconductor laser diode. More particularly, the present invention relates to a submount flip-chip bonded to a semiconductor laser diode chip having two stepped electrodes that are formed on the same side, a method of manufacturing the same, and a semiconductor laser diode assembly using the submount.

2. Description of the Related Art

As high-density information recording is increasingly being required, the demand for a visible light semiconductor laser diode is increasing. Therefore, semiconductor laser diodes made of various compounds capable of emitting a visible light laser are being developed. In particular, much attention has been paid to a group III-V nitride semiconductor laser diode because of its optical transition being of a direct transition type that induces high frequency laser emission and since it emits a blue light laser.

FIG. 1 shows a sectional view of a conventional GaN-based, group III-V nitride semiconductor laser diode chip having n-type and p-type electrodes, which are formed on the same side, and a ridge waveguide.

As shown in FIG. 1, a conventional GaN-based, group III-V nitride semiconductor laser diode chip has n-type and p-type electrodes, which are formed on the same side, and a ridge waveguide formed in the p-type electrode region.

In detail, an n-GaN layer 12 is formed on a sapphire substrate 10. The n-GaN layer 12 is divided into first and second regions R1 and R2. An n-type electrode 14 is formed on the second region R2 of the n-GaN layer 12. An n-AlGaN/GaN layer 16, an n-GaN layer 18, and an InGaN layer 20 as an active layer are subsequently formed on the first region R1 of the n-GaN layer 12 in sequence from smaller to larger refractive index. A p-GaN layer 22, a p-AlGaN/GaN layer 24, and a p-GaN layer 26 are formed on the InGaN layer 20 in sequence from larger to smaller refractive index. The upper central portion of the p-AlGaN/GaN layer 24 is protruded in the form of a ridge or rib and the p-GaN layer 26 is formed on top of the ridge. The p-AlGaN/GaN layer 24 is covered with a protective layer 28 having a channel 27 which communicates with the p-GaN layer 26. A p-type electrode 30 is formed on the protective layer 28 and the exposed middle surface of the p-GaN layer 26, and becomes in contact with both ends of the p-GaN layer 26 through the channel 27. In this structure, the p-type electrode 30 and the n-type electrode 14 are separated by a step height, h1.

Generally, a temperature has an effect on a critical current and laser mode stability for laser emission of semiconductor laser diodes. As a temperature increases, both of the characteristics are lowered. Therefore, there is a need to remove heat generated in the active layer during laser emission to thereby prevent overheating of laser diodes. In the case of using the structure of the aforementioned conventional GaN-based, group III-V semiconductor laser diode, most heat is discharged only through a ridge because of very low thermal conductivity of a substrate (for a sapphire substrate, about 0.5 W/cmK). However, because heat discharge through a ridge occurs limitedly, it is difficult to carry out efficient heat discharge. Therefore, lowering of characteristics of semiconductor devices that is caused by overheating of laser diodes is not efficiently prevented.

In this regard, a flip-chip bonding technology shown in FIG. 2 can be applied to the structure shown in FIG. 1 to discharge heat generated in an active layer.

Referring to FIG. 2, a reference numeral 50 indicates a semiconductor laser diode chip, which has an inverted structure of the conventional GaN-based, group III-V semiconductor laser diode shown in FIG. 1. A reference numeral 40 indicates a submount, a reference numeral 41 a substrate, and a reference numerals 42a and 42b first and second metal layers, respectively. A reference numerals 44a and 44b indicate first and second solder layers, which are respectively fused to an n-type electrode 14 and a p-type electrode 30 of the semiconductor laser diode chip 50.

By bonding a semiconductor laser diode to a separately prepared heat discharge structure shown in FIG. 2, heat discharge efficiency can be increased.

However, as shown in FIG. 2, the first and second solder layers 44a and 44b have different thicknesses in order to compensate for the step height, h1 between the n-type electrode 14 and the p-type electrode 30. That is, supposing that the thickness of the first metal layer 42a is the same as that of the second metal layer 42b, the first solder layer 44a is thicker than the second solder layer 44b by the height of h1. In this case, because the first and second solder layers 44a and 44b are not uniformly molten when respectively bonded to the two electrodes 14 and 30, there is a difference between the bonding states. FIG. 3 is a photograph showing the molten states of solder layers in the conventional submount shown in FIG. 2. As shown in FIG. 3, the first solder layer 44a and the second solder layer 44b run down while being molten non-uniformly.

The first and second solder layers 44a and 44b must have the same chemical composition ratio. Even if the chemical composition ratios of the first and second solder layers 44a and 44b slightly differ from each other, there is a large difference between their melting temperatures. As a result, the first solder layer 44a and the second solder layer 44b are not concurrently molten when bonded to the two electrodes 14 and 30, respectively, thereby causing a difference between the bonding states. In this regard, there is a need to concurrently form the first and second solder layers 44a and 44b under the same process.

As mentioned above, however, the first and second solder layers 44a and 44b differ in thickness. Therefore, in a method of manufacturing a submount, the first and second solder layers 44a and 44b cannot be concurrently formed. Rather, the two solder layers must be formed one after the other. For this reason, there exists a high likelihood for the first and second solder layers 44a and 44b to have different chemical composition ratios.

As mentioned above, if a bonding state between the first solder layer 44a and the n-type electrode 14 is different from that between the second solder layer 44b and the p-type electrode 30, heat generated upon operation of the semiconductor laser diode chip 50 is not efficiently delivered to the submount 40 thereby lowering heat discharge characteristics. As a result, heat within the active layer 20 is not sufficiently discharged. Consequently, the temperature of the semiconductor laser diode chip 50 increases and laser emission characteristics of the active layer 20 is lowered.

SUMMARY OF THE INVENTION

The present invention has been made in view of the above problems. It is an object of the present invention to provide a submount having solder layers with the same thickness and chemical composition ratio, and a method of manufacturing the same. The present invention also provides a semiconductor laser diode assembly comprising the submount.

According to an aspect of the present invention, there is provided a submount flip-chip bonded to a semiconductor laser diode chip with stepped first and second electrodes, the submount comprising: a substrate having first and second surfaces which are separated by a step height corresponding to a height difference between the first and second electrodes; first and second metal layers being formed to the same thickness on the first and second surfaces, respectively; and first and second solder layers being formed to the same thickness on the first and second metal layers, respectively, and being bonded to the first and second electrodes, respectively.

According to another aspect of the present invention, there is provided a semiconductor laser diode assembly comprising a semiconductor laser diode chip with stepped first and second electrodes and a submount flip-chip bonded to the semiconductor laser diode chip, the submount comprising: a substrate having first and second surfaces which are separated by a step height corresponding to a height difference between the first and second electrodes; first and second metal layers being formed to the same thickness on the first and second surfaces, respectively; and first and second solder layers being formed to the same thickness on the first and second metal layers, respectively, and being bonded to the first and second electrodes, respectively.

According to yet another aspect of the present invention, there is provided a method of manufacturing a submount flip-chip bonded to a semiconductor laser diode chip with stepped first and second electrodes, the method comprising: (a) etching a substrate to form first and second surfaces that are separated by a step height corresponding to a height difference between the first and second electrodes; (b) depositing a metal on the first and second surfaces to form first and second metal layers of the same thickness; and (c) depositing a solder on the first and second metal layers to form first and second solder layers of the same thickness to be respectively bonded to the first and second electrodes.

According to specific embodiments of the present invention, in step (a), the substrate may be dry etched.

The substrate may be made of one of AlN, SiC, GaN, and an insulating material having a heat transfer coefficient corresponding to that of one of AlN, SiC, and GaN. The first and second metal layers may be made of an alloy of two or more selected from the group consisting of Cr, Ti, Pt, and Au. The first and second solder layers may be made of an alloy of two or more selected from the group consisting of Cr, Ti, Pt, Au, Mo, and Sn.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in more detail with reference to the accompanying drawings.

Figure 4:
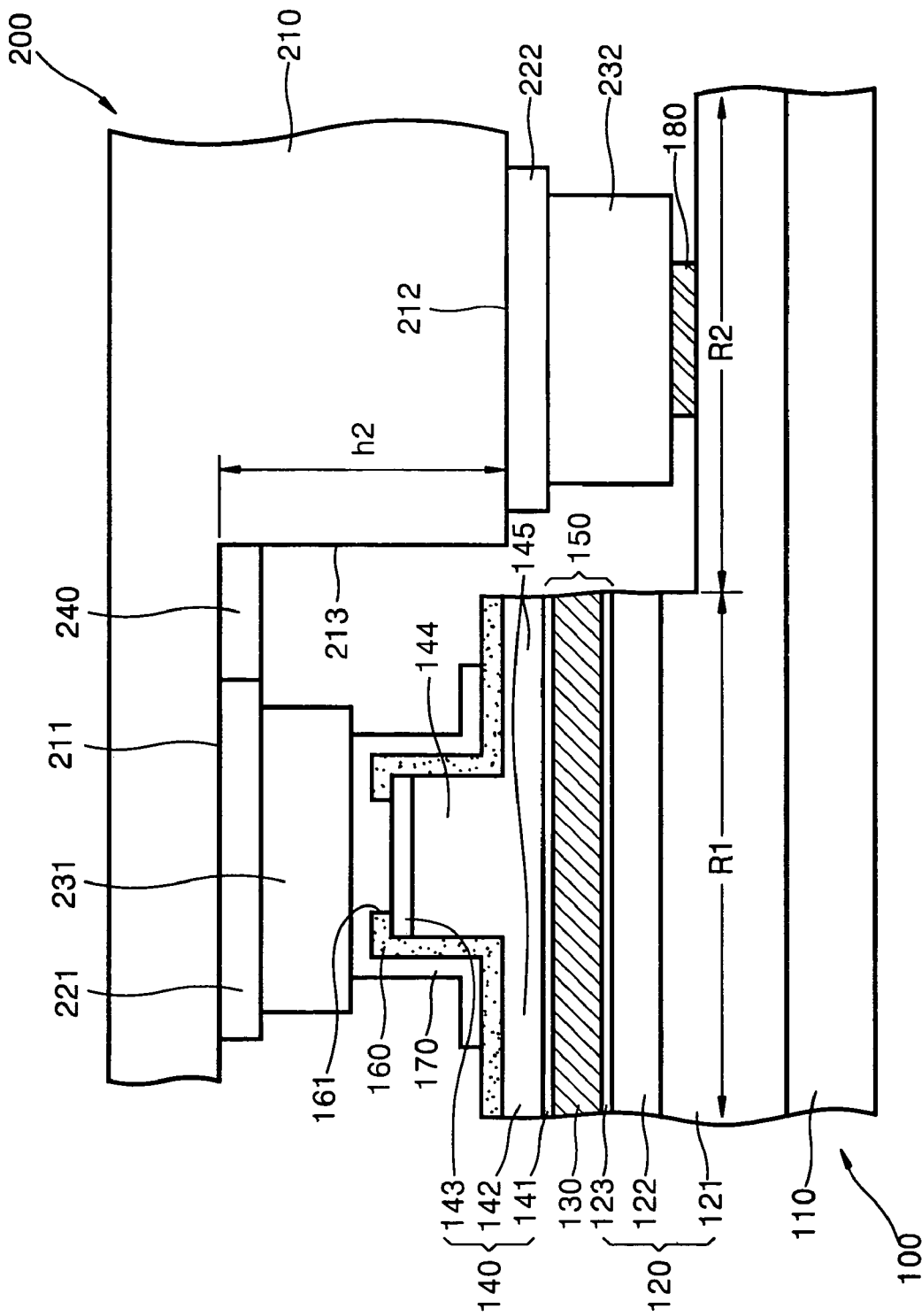
FIG. 4 is a sectional view of a semiconductor laser diode assembly according to an embodiment of the present invention.

FIG. 4 is a sectional view of a semiconductor laser diode assembly according to an embodiment of the present invention. The illustration of the semiconductor laser diode assembly of FIG. 4 has been exaggerated to show characteristics of the present invention more clearly.

A submount 200 flip-chip bonded to a semiconductor laser diode chip 100 is shown in FIG. 4. The semiconductor laser diode chip 100 is a GaN-based, group III-V nitride semiconductor laser diode chip.

The semiconductor laser diode chip 100 comprises a substrate 110, a first material layer 120, an active layer 130, and a second material layer 140 which are sequentially laminated on the substrate 110.

In detail, a first semiconductor layer 121 is mounted on the substrate 110. The substrate 110 may be a GaN- or SiC-based, group III-V semiconductor substrate or a high resistance substrate such as a sapphire substrate. The first semiconductor layer 121 may be an n-type GaN-based, group III-V nitride semiconductor material layer or an undoped material layer. An n-GaN layer is preferable. The first semiconductor layer 121 is divided into first and second regions R1 and R2. An n-type electrode 180, which is used as a first electrode, is mounted on the second region R2.

A first cladding layer 122 and a resonance layer 150 are sequentially mounted on the first semiconductor layer 121. The first cladding layer 122 is an n-AlGaN/GaN layer. The resonance layer 150 comprises a first waveguide layer 123, an active layer 130, and a second waveguide layer 141 which are sequentially mounted on the first cladding layer 122. The first semiconductor layer 121, the first cladding layer 122, and the first waveguide layer 123 form the first material layer 120, which induces lasing for laser emission. Therefore, the first semiconductor layer 121 forms the lowest layer of the first material layer 120. The active layer 130 is a material layer for inducing lasing by recombination between electrons and holes. Preferably, the active layer is a GaN-based, group III-V nitride semiconductor layer having a multi-quantum well (MQW) structure, and more preferably, a $In_xAl_yGa_{1-x-y}N$ layer where $0 \leq x \leq 1$, $0 \leq y \leq 1$, and $x+y \leq 1$. In addition, the active layer 130 may be a GaN-based, group III-V nitride semiconductor layer containing a predetermined ratio of Indium (In), for example an InGaN layer. The first and second waveguide layers 123 and 141 are GaN-based, group III-V nitride semiconductor layers, preferably an n-GaN layer and a p-GaN layer, respectively. The first and second waveguide layers 123 and 141 have reflective indices lower than the active layer 130 and higher than the first cladding layer 122 and a second cladding layer as will be described later. The second cladding layer 142 and a second semiconductor layer 143 are sequentially mounted on the resonance layer 150. The second waveguide layer 141, the second cladding layer 142, and the second semiconductor layer 143 form the second material layer 140, which induces lasing for laser emission in the active layer 130. Therefore, the second semiconductor layer 143 forms the highest layer of the second material layer 140.

The second cladding layer 142 comprises a projection 144 in the form of a ridge, which corresponds to the center portion of the resonance layer 150, and a portion 145 which is thinner than the projection 144. The second semiconductor layer 143, which is the highest layer of the second material layer 140, is mounted on the projection 144 of the second cladding layer 142. The second cladding layer 142 is made of the same material as the first cladding layer 122 except that a p-type material is doped. The second semiconductor layer 143 is a GaN-based, III-V nitride semiconductor layer, preferably a p-type conductive impurity-doped direct transition layer, and more preferably a p-GaN layer. In addition, the second semiconductor layer 143 may be a GaN layer, or an AlGaN layer or InGaN layer containing a predetermined ratio of Al or In, like the first semiconductor layer 121. The second cladding layer 142 is covered with a protective layer 160 having a channel 161, which communicates with the second semiconductor layer 143. A p-type electrode 170, used as a second electrode, is mounted on the protective layer 160 and on the exposed middle surface of the second semiconductor layer 143, and becomes in contact with both ends of the second semiconductor layer 143 through the channel 161.

In this semiconductor laser diode chip 100, the p-type electrode 170 and the n-type electrode 180 are separated by a step height.

The submount 200 serves to discharge heat generated during the operation of the semiconductor laser diode chip 100 while being flip-chip bonded to the semiconductor laser diode chip 100. The submount 200 comprises a substrate 210, first and second metal layers 221 and 222, and first and second solder layers 231 and 232.

The substrate 210 has a first surface 211 and a second surface 212. The first and second surfaces 211 and 212 are formed opposite to the p-type electrode 170 and the n-type electrode 180, respectively. Preferably, the height difference (h2) between the first and second surfaces 211 and 212 is the same as that between the p-type electrode 170 and the n-type electrode 180. Preferably, the substrate 210 is made of one of AlN, SiC, GaN, and an insulating material having a heat transfer coefficient corresponding to that of one of AlN, SiC, and GaN.

The first and second metal layers 221 and 222 are mounted on the first and second surfaces 211 and 212, respectively. Preferably, the first and second metal layers 221 and 222 are made of an alloy of two or more selected from the group consisting of Cr, Ti, Pt, and Au, such as Cr/Au and Ti/Pt/Au.

The first and second solder layers 231 and 232, which are bonded to the p-type and n-type electrodes 170 and 180, respectively, are mounted on the first and second metal layers 221 and 222, respectively. Preferably, the first and second solder layers 231 and 232 are made of an alloy of two or more selected from the group consisting of Cr, Ti, Pt, Au, Mo, and Sn, such as Au/Sn, Pt/Au/Sn, and Cr/Au/Sn.

Preferably, the first metal layer 221 and the first solder layer 231 are insulated from the second metal layer 222 and the second solder layer 232, respectively. In order to achieve this insulation, the submount may further comprise an insulating layer 240 between the first metal layer 221 and the second metal layer 222. As shown in FIG. 4, the insulating layer 240 extends to the first metal layer 221 from an interface 213 between the first surface 211 and the second surface 212.

Preferably, the first and second metal layers 221 and 222 have the same thickness and the first and second solder layers 231 and 232 have the same thickness. In such a structure, the height difference between the first and second solder layers 231 and 232 are the same as that between the p-type and n-type electrodes 170 and 180.

Figure 1:
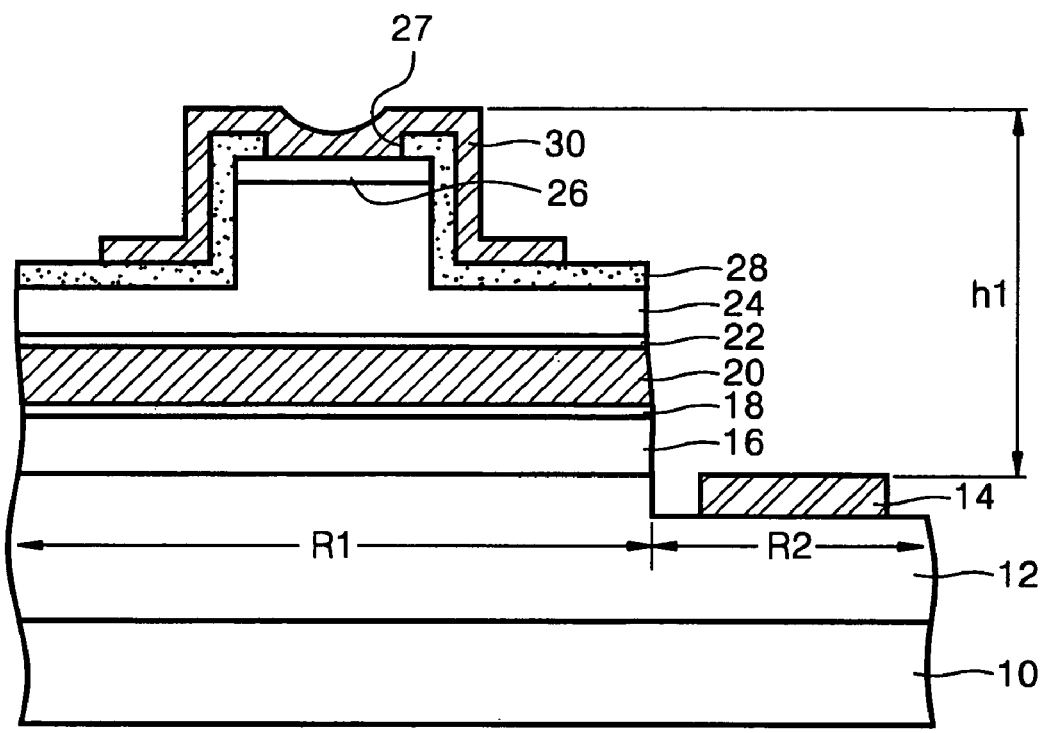
FIG. 1 is a sectional view of a conventional GaN-based, group III-V nitride semiconductor laser diode chip having n-type and p-type electrodes, which are formed on the same side, and a ridge waveguide.
Figure 2:
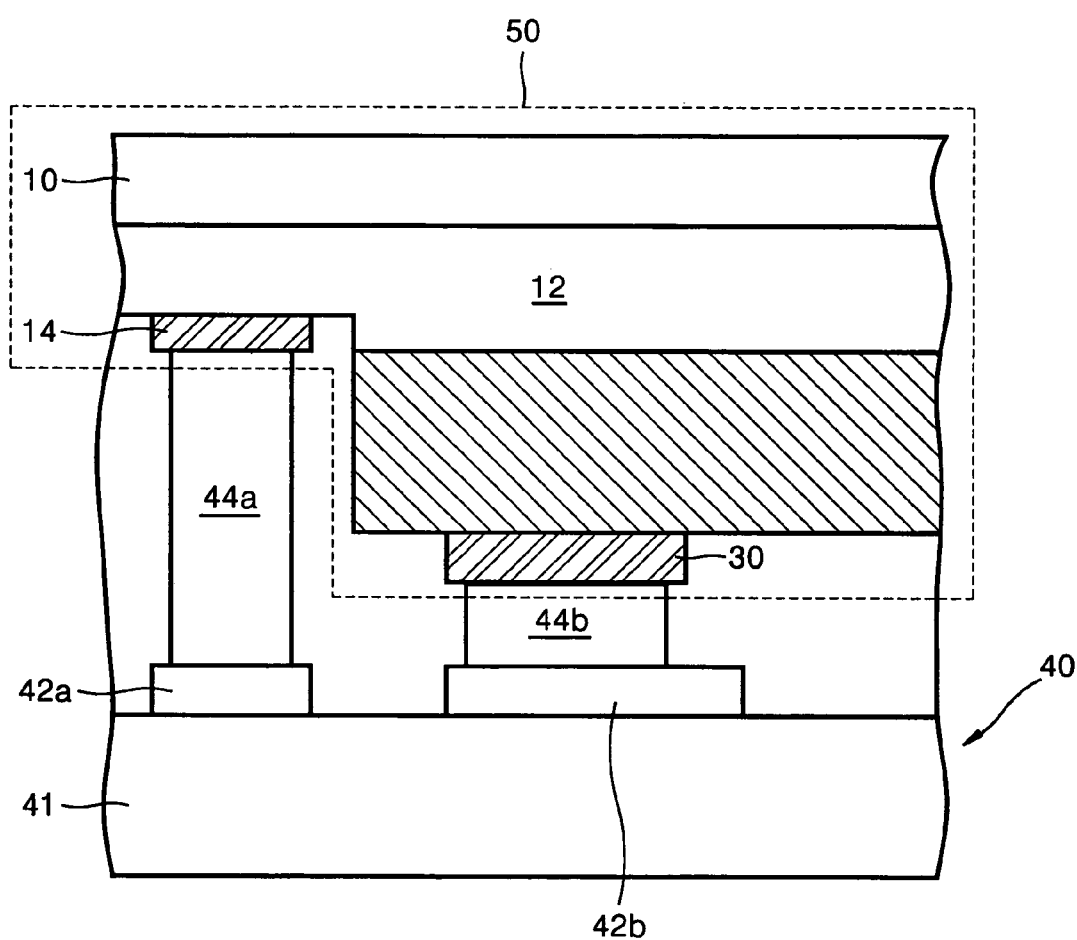
FIG. 2 is a sectional view of a submount bonded to the semiconductor laser diode chip shown in FIG. 1.
Figure 3:
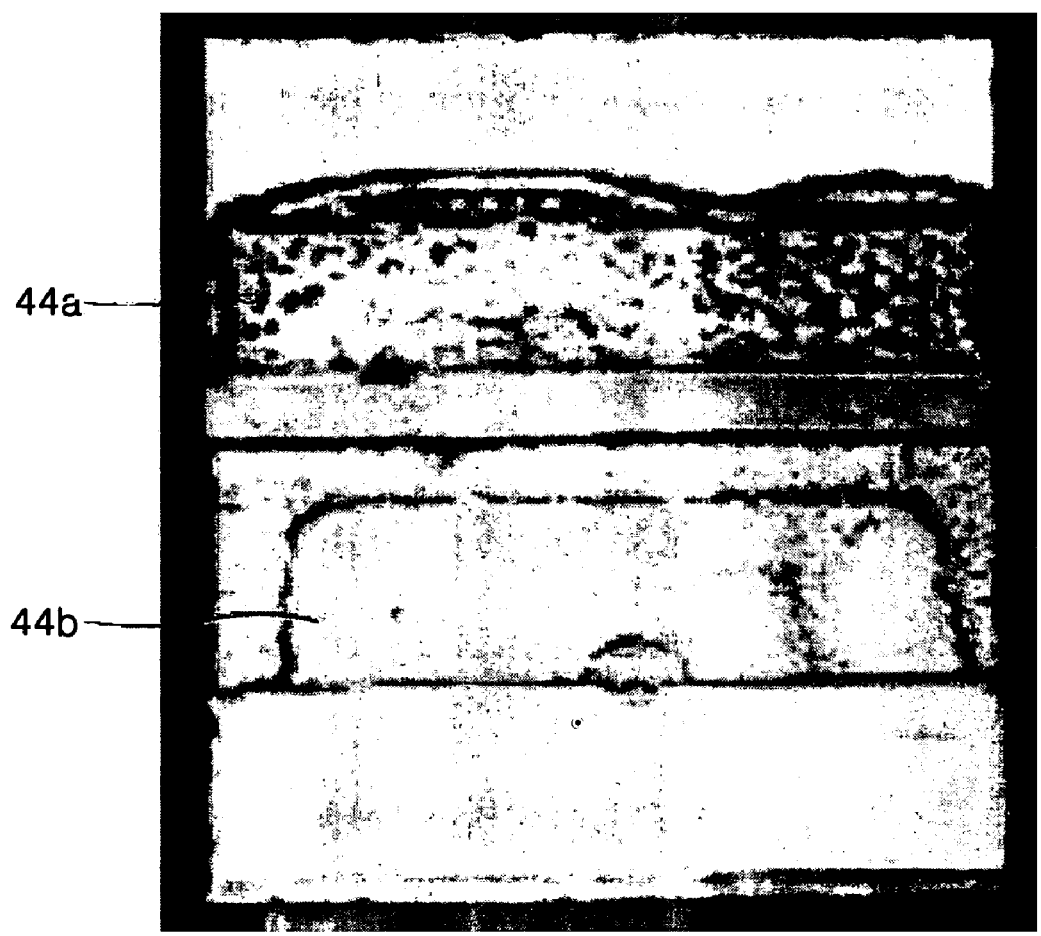
FIG. 3 is a photograph showing the molten states of solder layers of a conventional submount shown in FIG. 2.
Figure 5:
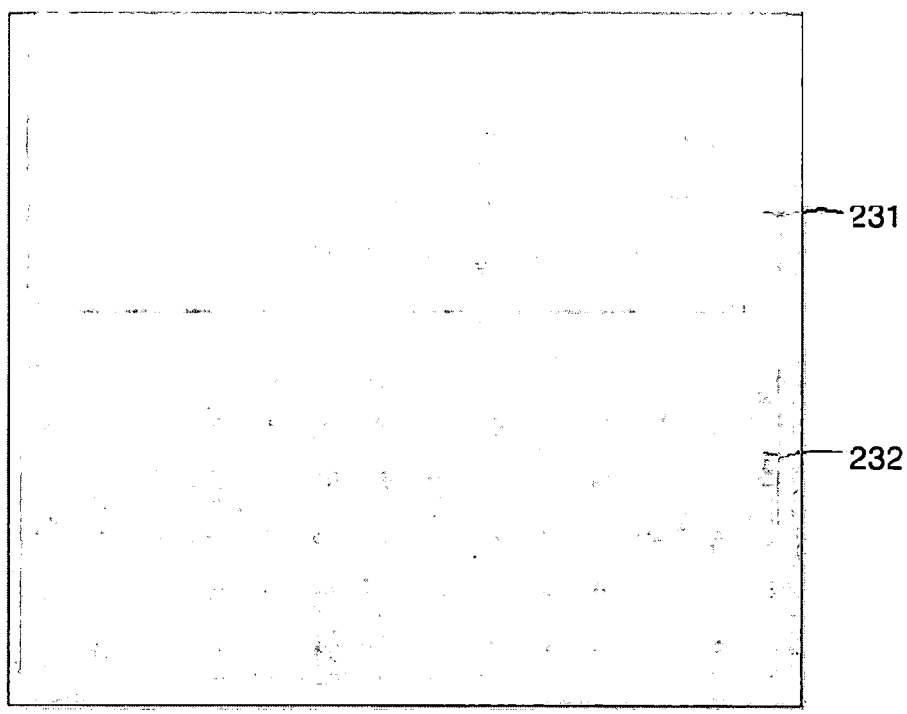
FIG. 5 is a photograph showing the molten states of first and second solder layers of the submount shown in FIG. 4.

Accordingly, when the submount 200 is mounted on the semiconductor laser diode chip 100, the p-type electrode 170 becomes in contact with the first solder layer 231 and the n-type electrode 180 becomes in contact with the second solder layer 232. At this time, when heat is applied, the first and second solder layers 231 and 232 are concurrently molten at the same temperature and uniformly bonded to the p-type and n-type electrodes 170 and 180, respectively. This concurrent melting is possible because the first and second solder layers 231 and 232 have the same thickness. FIG. 5 is a photograph showing the molten states of the first and second solder layers 231 and 232. It can be seen from FIG. 5 that the first and second solder layers 231 and 232 have been uniformly molten, when compared to FIG. 3. Therefore, the heat discharge efficiency by the submount 200 is improved, thereby enhancing the light-emitting characteristics of the semiconductor laser diode chip 100.

A method of manufacturing a submount according to an embodiment of the present invention will now be described with reference to FIGS. 6A through 6D.

Figure 6A:
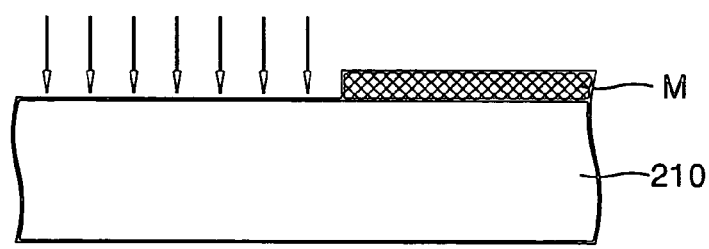
FIGS. 6A through 6D are sectional views showing processes of manufacturing a submount according to an embodiment of the present invention.
Figure 6B:
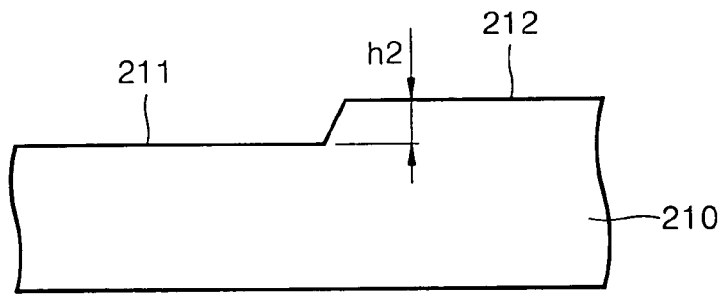
Figure 7:
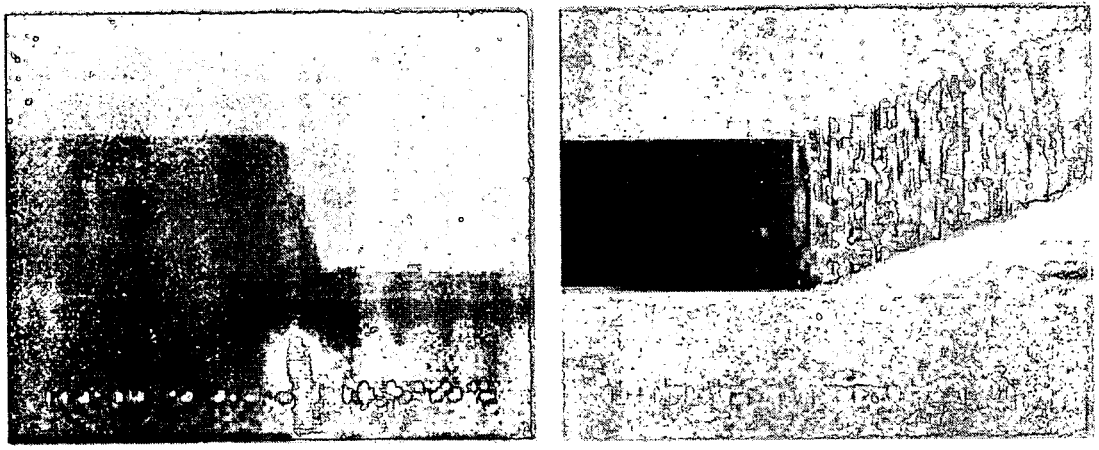
FIG. 7 is a photograph showing a substrate after an etching process shown in FIG. 6A.

As shown in FIG. 6A, first, an etching mask M is placed on the surface of a substrate 210 made of one of AlN, SiC, GaN, and an insulating material having a heat transfer coefficient corresponding to that of one of AlN, SiC, and GaN. When a non-masked surface of the substrate 210 is etched to a predetermined depth, the etching mask M is removed. After the etching, an etched first surface 211 and a non-etched second surface 212 are formed, as shown in FIG. 6B. A photograph of the etched substrate 210 is shown in FIG. 7. In this case, the etching depth is adjusted such that the height difference between the first surface 211 and the second surface 212 equals to that between the p-type and n-type electrodes 170 and 180 of the semiconductor laser diode chip 100. Dry etching is preferable.

Figure 6C:
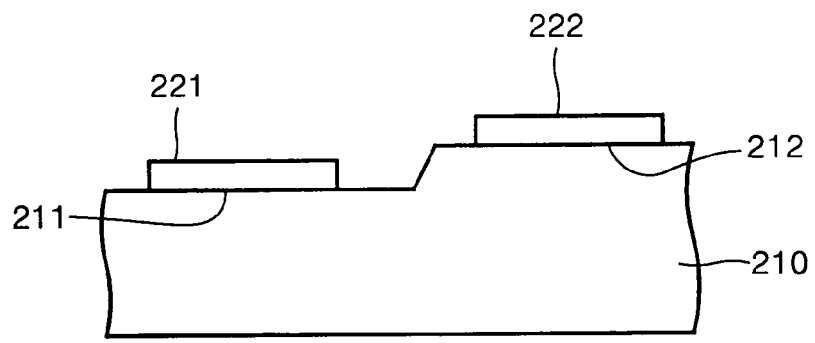

Next, a masking process is carried out on the first and second surfaces 211 and 212 to define regions for the first and second metal layers 221 and 222. Then, an alloy of two or more selected from the group consisting of Cr, Ti, Pt, and Au, such as Cr/Au and Ti/Pt/Au, is deposited at a predetermined thickness. When the masking is removed, the first and second metal layers 221 and 222 are formed on the first and second surfaces 211 and 212, respectively, as shown in FIG. 6C. Preferably, the first and second metal layers 221 and 222 have the same thickness.

Figure 6D:
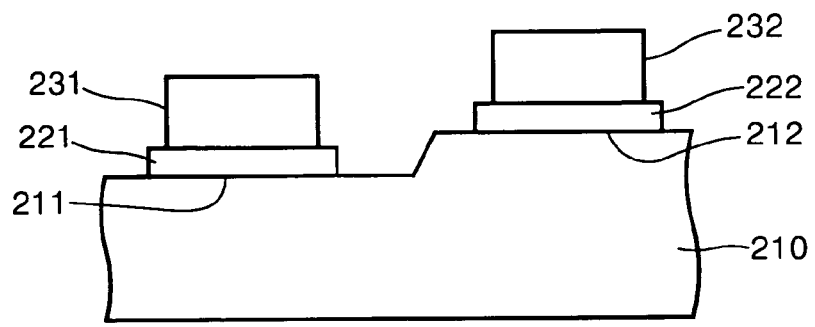

Next, a masking process is carried out on the first and second metal layers 221 and 222 to define regions for the first and second solder layers 231 and 232. Then, an alloy of two or more selected from the group consisting of Cr, Ti, Pt, Au, Mo, and Sn, such as Au/Sn, Pt/Au/Sn, and Cr/Au/Sn, are deposited at a predetermined thickness. When the masking is removed, the first and second solder layers 231 and 232 are formed on the first and second metal layers 221 and 222, respectively, as shown in FIG. 6D. Preferably, the first and second solder layers 231 and 232 are concurrently formed to the same thickness. As a result, the first and second solder layers 231 and 232 have almost the same chemical composition ratio.

According to the aforementioned method, a submount having the same height difference between the first and second solder layers 231 and 232 as that between the p-type and n-type electrodes 170 and 180 can be formed.

As apparent from the above description, a semiconductor laser diode assembly and its manufacturing method of the present invention provide the following effects.

Two solder layers of a submount fused to two stepped electrodes of a semiconductor laser diode chip are concurrently formed to the same thickness by a simple process. As a result, the two solder layers have the same chemical composition ratio, thereby providing almost the same melting properties.

When the submount is flip-chip bonded to the semiconductor laser diode chip, the two solder layers are uniformly fused to the two electrodes. In this case, heat generated during the operation of the semiconductor laser diode chip can be efficiently discharged through the submount. As a result, the light-emitting efficiency of the semiconductor laser diode chip can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A submount flip-chip bonded to a semiconductor laser diode chip with stepped first and second electrodes, the submount comprising:

a substrate having first and second surfaces which are separated by a step height corresponding to a height difference between the first and second electrodes;

first and second metal layers being formed to the same thickness on the first and second surfaces, respectively; and first and second solder layers being formed to the same thickness on the first and second metal layers, respectively, and being bonded to the first and second electrodes, respectively.

2. The submount according to claim 1, wherein the substrate is made of one of AlN, SiC, GaN, and an insulating material having a heat transfer coefficient corresponding to that of one of AlN, SiC, and GaN.

3. The submount according to claim 1, wherein the first and second metal layers are made of an alloy of two or more selected from the group consisting of Cr, Ti, Pt, and Au.

4. The submount according to claim 1, wherein the first and second solder layers are made of an alloy of two or more selected from the group consisting of Cr, Ti, Pt, Au, Mo, and Sn.

5. A semiconductor laser diode assembly comprising a semiconductor laser diode chip with stepped first and second electrodes and a submount flip-chip bonded to the semiconductor laser diode chip, the submount comprising:

a substrate having first and second surfaces which are separated by a step height corresponding to a height difference between the first and second electrodes;

first and second metal layers being formed to the same thickness on the first and second surfaces, respectively; and first and second solder layers being formed to the same thickness on the first and second metal layers, respectively, and being bonded to the first and second electrodes, respectively.

* * * * *